United States Patent
Lin et al.

(10) Patent No.: US 9,640,742 B2
(45) Date of Patent: May 2, 2017

(54) LED PACKAGE WITH REFLECTING CUP

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/826,446

(22) Filed: Aug. 14, 2015

(65) Prior Publication Data

US 2016/0118557 A1    Apr. 28, 2016

(30) Foreign Application Priority Data

Oct. 23, 2014    (CN) .......................... 2014 1 0569770

(51) Int. Cl.
| *H01L 33/62* | (2010.01) |
| *H01L 33/38* | (2010.01) |
| *H01L 33/60* | (2010.01) |
| *H01L 33/48* | (2010.01) |

(52) U.S. Cl.
CPC ............ *H01L 33/60* (2013.01); *H01L 33/486* (2013.01); *H01L 33/62* (2013.01); *H01L 2224/48247* (2013.01); *H01L 2224/48257* (2013.01)

(58) Field of Classification Search
CPC ......... H01L 33/60; H01L 33/38; H01L 33/54; H01L 33/486
USPC ................................................... 257/98
See application file for complete search history.

(56) References Cited

U.S. PATENT DOCUMENTS

2011/0309405 A1    12/2011    Lee

FOREIGN PATENT DOCUMENTS

EP         2418700 A2     2/2012

*Primary Examiner* — Asok K Sarkar
*Assistant Examiner* — Dmitriy Yemelyanov
(74) *Attorney, Agent, or Firm* — Steven Reiss

(57) ABSTRACT

The present disclosure provides an LED package which includes electrodes, an LED die electrically connected with the electrodes, an encapsulation covering the LED die; and a casing surrounding the encapsulation and the LED die. The casing includes a base, a reflecting cup and a supporting portion. The reflecting cup extends from the base upwards, the reflecting cup surrounds the LED die, and the supporting portion is located inside the reflecting cup and across the electrodes.

15 Claims, 4 Drawing Sheets

LED PACKAGE WITH REFLECTING CUP

CROSS-REFERENCE TO RELATED APPLICATIONS

This application claims priority to Chinese patent application no. 201410569770.8 filed on Oct. 23, 2014, the contents of which are incorporated by reference herein.

FIELD

The subject matter generally relates to light emitting diode (LED) packages, particularly relates to an LED package having a reflecting cup.

BACKGROUND

Illumination devices can be based on one or more different light sources. For example, light sources can include incandescent light bulbs, compact fluorescent lamps and fluorescent tubes. Recent developments have made use of light emitting diodes. In some implantations, the illumination device can include a reflective cup in conduction with an LED package.

BRIEF DESCRIPTION OF THE DRAWINGS

Implementations of the present technology will now be described, by way of example only, with reference to the attached figures.

DETAILED DESCRIPTION

Figure 1:
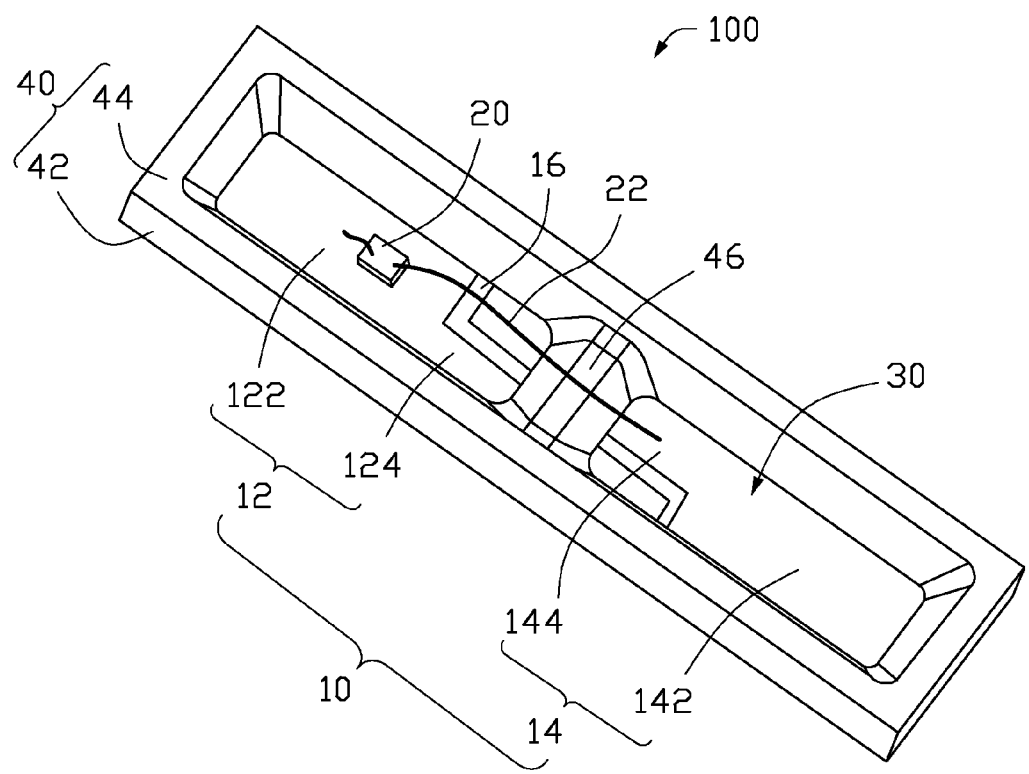
FIG. 1 is a diagrammatic, isometric view of a light emitting diode package in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts can be exaggerated to better illustrate details and features of the present disclosure.

A definition that applies throughout this disclosure will now be presented.

The term "comprising," when utilized, means "including, but not necessarily limited to"; it specifically indicates open-ended inclusion or membership in the so-described combination, group, series and the like.

The present disclosure is described in relation to an LED package having a reflecting cup.

FIG. 1 illustrates an LED 100 in accordance with an exemplary embodiment of the present disclosure. The LED package 100 includes a plurality of electrodes 10, an LED die 20 electrically connected with the electrodes 10, a encapsulation 30 covering and sealing the LED die 20, a casing 40 surrounding the LED die 20 and the encapsulation 30. The casing 40 includes a base 42 and a reflecting cup 44. The reflecting cup 44 extends from the base 42 upwards and surrounds the LED die 20. The casing 40 further includes a supporting portion 46 inside the reflecting cup 44 and across the electrodes 10.

Figure 2:
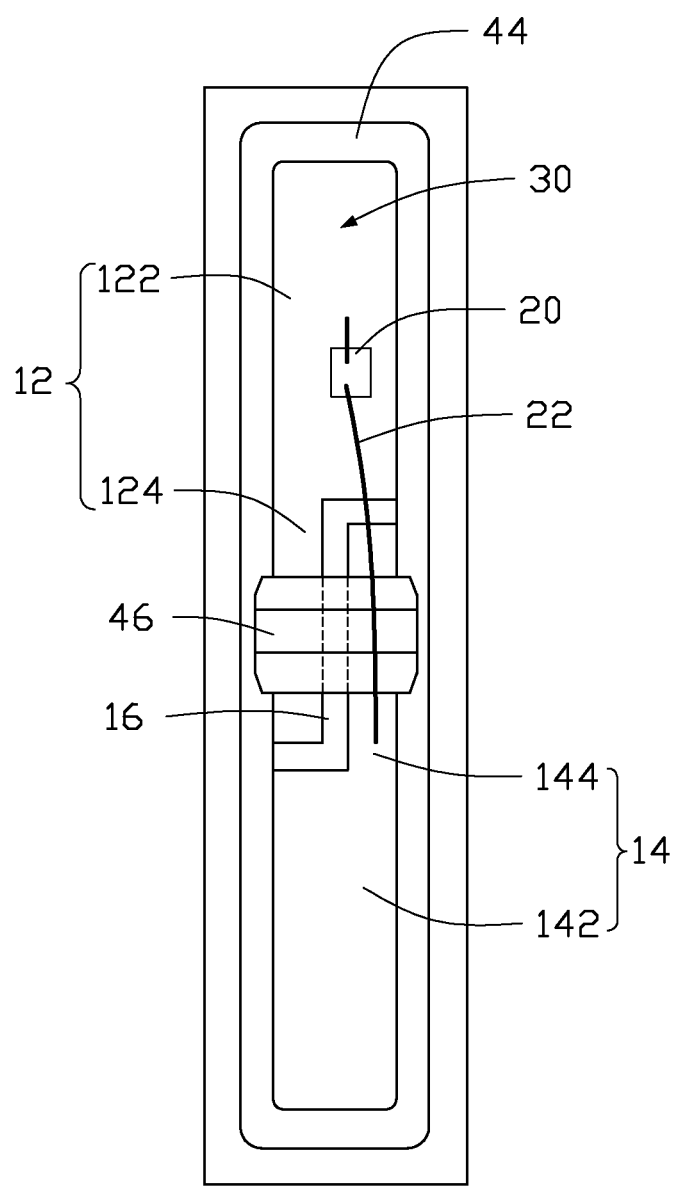
FIG. 2 is a top view of the light emitting diode package in FIG. 1.

FIG. 2 illustrates that the electrodes 10 includes a first electrode 12 and a second electrode 14 spaced from the first electrode 12. The first electrode 12 includes a first body 122 and a first extending portion 124. The second electrode 14 includes a second body 142 and a second bottom extending portion 144. The first body 122 of the first electrode 12 and the second body 142 of the second electrode 14 are separated from each other. The first extending portion 124 extends from the first body 122 towards the second electrode 14. The second extending portion 144 extends from the second body 142 towards the first electrode 12. An insulating layer 16 is defined between the first extending portion 124 and the second extending portion 144 and separates the first extending portion 124 and the second extending portion 144. The first electrode 12 and the second electrode 14 are formed on the base 42 of the casing 40.

Figure 3:
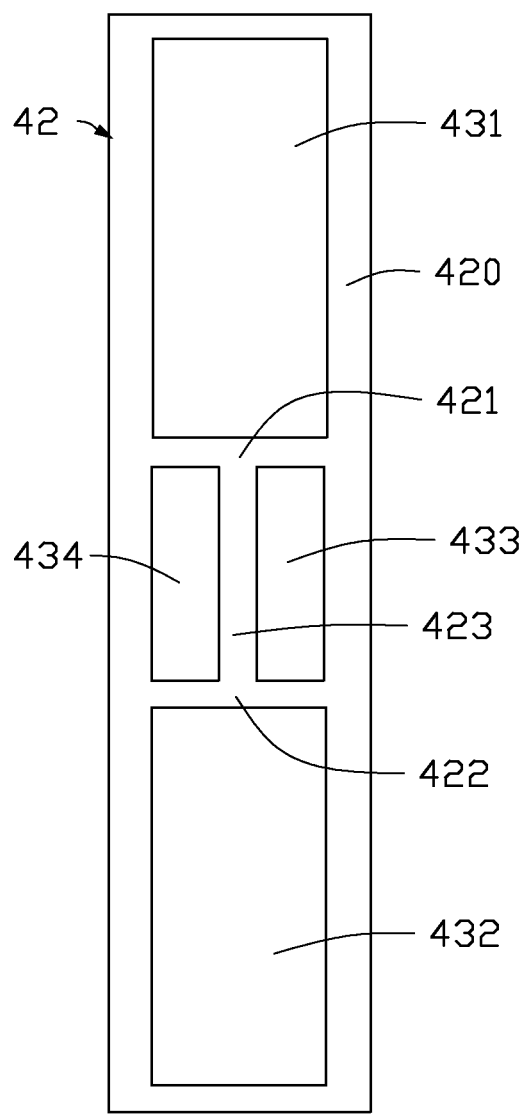
FIG. 3 is a bottom view of a base of the light emitting diode package in FIG. 1.

FIG. 3 illustrates the base 42 from bottom. The base 42 includes a frame 420 and three brackets, named as a first bracket 421, a second bracket 422 and a third bracket 423. In this embodiment, the frame 420 is rectangular-shaped. The brackets are formed inside the frame 420. The frame 420 includes two opposite long sides and two wide sides. The first bracket 421 and the third bracket 423 are spaced from each other and both extend from one of the long sides to the other. The second bracket 422 is connected between the first bracket 421 and the third bracket 423. Bottom surfaces of the first bracket 421, the second bracket 422 and the third bracket 423 are coplanar.

Figure 4:
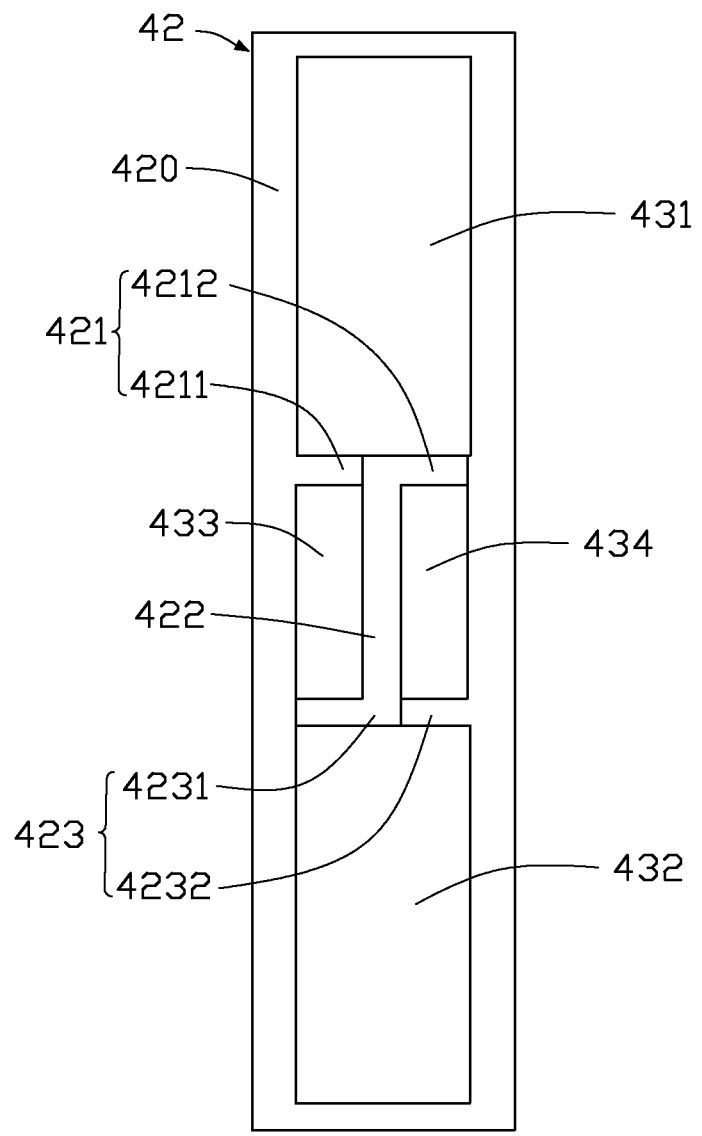
FIG. 4 is a top view of the base of the light emitting diode package in FIG. 3.

FIG. 4 illustrates the base 42 from top. A portion of the first bracket 421 has the same height as the second bracket 422, and a portion of the third bracket 423 has the same height as the second bracket 422. The first bracket 421 has two portions, namely a first left portion 4211 and a first right portion 4212. The third bracket 423 has two portions, namely a third left portion 4231 and a third right portion 4232. In at least one embodiment, the portion of the first bracket 421 having the same height with the second bracket 422 is the first right half 4212, and the portion of the third bracket 423 having the same height with the second bracket 422 is the third left half 4231. The first right half 4212 of the first bracket 421, the second bracket 422 and the third left half 4231 of the third bracket 423 together form a "Z" shape. Correspondingly, the other half of the first bracket 421, that is the first left half 4211 of the first bracket 421, has a lower height than the second bracket 422. The other half of the third bracket 4232, that is the third right half 4232, also has a lower height than the second bracket 422.

The frame 420 of the base 42 surrounds the first bracket 421, the second bracket 422 and the third bracket 423 to define a first body cavity 431, a second body cavity 432, a first extending cavity 433 and a second extending cavity 434. The first body cavity 431 is surrounded by the first bracket 421 and the frame 420. The second body cavity 432 is surrounded by the third bracket 423 and the frame 420. The first extending cavity 433 and the second extending cavity 434 are located between the first bracket 421 and the third bracket 423 and separated by the second bracket 422.

The electrodes 10 are formed by filling metal material in the first body cavity 431, the second body cavity 432, the first extending cavity 433 and the second extending cavity 434. The first electrode 12 is formed in the first body cavity 431 and the first extending cavity 433 and connects the first body cavity 431 and the first extending cavity 433. The second electrode 14 is formed in the second body cavity 432 and the second extending cavity 434 and connects the second body cavity 432 and the second extending cavity 434. The first electrode 12 and the second electrode 14 are separated by the first right half 4212 of the first bracket 421, the second bracket 422 and the third left half 4231 of the third bracket 423. Alternatively, shapes of the first bracket 421, the second bracket 422 and the third bracket 423 are not limited to what is illustrated and described. In alternative embodiments responding to the shape can be configured to conform to a desired form factor.

FIG. 1 illustrates that the reflecting cup 44 surrounds the LED die 20 and the electrodes 10. The reflecting cup 44 extends from the frame 420 of the base 42 along a height of the LED package 100. The reflecting cup 44 has side walls 442. In at least one embodiment, the reflecting cup 44 is rectangular shape. A number of the side walls 442 is four. The supporting portion 46 is positioned inside the reflecting cup 44 and across the first electrode 12 and the second electrode 14, thereby supporting the reflecting cup 44 and enhancing strength thereof. The supporting portion 46 is lower than the reflecting cup 44. In at least one embodiment, the supporting portion 46 extends from one of the side walls 442 to a corresponding opposite one. The supporting portion 46 is formed on the second bracket 422 and positioned between the first bracket 421 and the third bracket 423. The supporting portion 46 bestrides the first electrode 12 and the second electrode 14. Specially, the supporting portion 46 bestrides the first extending portion 124 of the first electrode 12, the second bracket 422 of the base 420, and the second extending portion 144 of the second electrode 14. In at least one embodiment, the supporting portion 46 extends along a direction perpendicular to the first extending portion 124 and the second extending portion 144.

The LED die 20 can be mounted on the electrodes 10 via wire bonding or flip chip bonding. In at least one embodiment, the LED die 20 is mounted on one of the first electrode 12 and the second electrode 14. The LED die 20 is connected with the electrodes 10 via wire bonding. In at least one embodiment, the LED die 20 is mounted on the first electrode 12. A wire connects the LED die 20 and the second electrode 14, over the supporting portion 46.

The encapsulation 30 covers the LED die 20 in the casing 40. The encapsulation 30 is filled in the reflecting cup 44 and covers the LED die 20 and the electrode 10. Top of the encapsulation 30 is coplanar to top of the reflecting cup 44. The encapsulation 30 can also has at least one of phosphor powders diffused therein.

It is to be further understood that even though numerous characteristics and advantages have been set forth in the foregoing description of embodiments, together with details of the structures and functions of the embodiments, the disclosure is illustrative only; and that changes may be made in detail, according in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED package. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) package comprising:
a plurality of electrodes;
an LED die electrically connected with the plurality of electrodes;
an encapsulation covering the LED die; and
a casing surrounding the encapsulation and the LED die, the casing comprising: a base; a reflecting cup extending upwards from the base upwards and surrounding the LED die; and a supporting portion being located inside the reflecting cup and across the electrodes;
wherein the base comprises a frame and a plurality of brackets, and the brackets are formed inside the frame, the brackets comprise a first bracket, a second bracket, and a third bracket, the first bracket and the third bracket are spaced from each other, two ends of the first bracket are separately connected to the frame, two ends of the second bracket are also separately connected to the frame, and the second bracket is connected between the first bracket and the third bracket.

2. The LED package of claim 1, wherein the reflecting cup extends from the frame along a height of the light emitting diode.

3. The LED package of claim 1, wherein the first bracket is parallel to the third bracket, and the supporting portion is located between the first bracket and the third bracket.

4. The LED package of claim 1, wherein a portion of the first bracket has the same height with the second bracket, and a portion of the third bracket has the same height with the second bracket, the portion of the first bracket, the portion of the third bracket and the second bracket separate the electrodes, the other portion of the first bracket has a lower height than the second bracket, and the other portion of the third bracket also has a lower height than the second bracket.

5. The LED package of claim 4, wherein the portion of the first bracket having the same height with the second bracket, the portion of the third bracket having the same height with the second bracket, and the second bracket together form a Z shape.

6. The LED package of claim 4, wherein the portion of the first bracket having the same height with the second bracket is a right half of the first bracket and the portion of the third bracket having the same height with the second bracket is a left half of the second bracket.

7. The LED package of claim 1, wherein the frame of the base surrounds the first bracket, the second bracket and the third bracket to define a first body cavity, a second body cavity, a first extending cavity and a second extending cavity, the first body cavity, the second body cavity, the first extending cavity and the second extending cavity are separated from each other.

8. The LED package of claim 7, wherein the electrodes comprise a first electrode and a second electrode spaced from the first electrode, the first electrode comprises a first body and a first extending portion, the second electrode comprises a second body and a second extending portion.

9. The LED package of claim 8, wherein the first extending portion extends from the first body towards the second electrode, and the second extending portion extends from the second body towards the first electrode.

10. The LED package of claim 8, wherein the first electrode is formed in the first body cavity and the first extending cavity, and the first electrode is formed in the first body cavity and the first extending cavity.

11. The LED package of claim 8, wherein the supporting portion bestrides the first extending portion of the first electrode, the third bracket of the base, and the second extending portion of the second electrode.

12. A light emitting diode (LED) package, comprising:
a plurality of electrodes;
an LED die electrically connected with the electrodes;
an encapsulation covering the LED die; and
a base surrounding the encapsulation and the LED die;
a reflecting cup extending from the base upwards and surrounding the LED die; and
a supporting portion being located inside the reflecting cup and bestriding the electrodes;
wherein the base comprises a frame and a plurality of brackets, and the brackets are formed inside the frame, the brackets comprise a first bracket, a second bracket, and a third bracket, the first bracket and the third bracket are spaced from each other, two ends of the first bracket are separately connected to the frame, two ends of the second bracket are also separately connected to the frame, and the second bracket is connected between the first bracket and the third bracket.

13. The LED package of claim 12, wherein the reflecting cup extends from the frame along a height of the light emitting diode.

14. The LED package of claim 12, wherein a portion of the first bracket has the same height with the second bracket, and a portion of the third bracket has the same height with the second bracket, the portion of the first bracket, the portion of the third bracket and the second bracket separate the electrodes, the other portion of the first bracket has a lower height than the second bracket, and the other portion of the third bracket also has a lower height than the second bracket.

15. The LED package of claim 14, wherein the portion of the first bracket having the same height with the second bracket, the portion of the third bracket having the same height with the second bracket, and the second bracket together form a Z shape.

* * * * *